US006443814B1

(12) United States Patent
Miller et al.

(10) Patent No.: US 6,443,814 B1
(45) Date of Patent: Sep. 3, 2002

(54) METHOD AND CHEMISTRY FOR CLEANING OF OXIDIZED COPPER DURING CHEMICAL MECHANICAL POLISHING

(75) Inventors: Anne E. Miller; A. Daniel Feller; Kenneth C. Cadien, all of Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/962,428

(22) Filed: Sep. 24, 2001

Related U.S. Application Data

(62) Division of application No. 09/729,609, filed on Dec. 4, 2000.

(51) Int. Cl.[7] .............................................. H01L 21/302
(52) U.S. Cl. .............................. 451/41; 134/3; 134/28; 134/902
(58) Field of Search .............................. 451/41, 54, 57, 451/287–290; 134/3, 26, 28, 902; 156/636

(56) References Cited

U.S. PATENT DOCUMENTS

| 5,478,436 A | * | 12/1995 | Winebarger et al. ..... 156/636.1 |
| 5,482,174 A | * | 1/1996 | Namiki et al. ................. 216/41 |
| 5,645,737 A | * | 7/1997 | Robinson et al. ............. 216/99 |
| 5,830,280 A | * | 11/1998 | Sato et al. ...................... 134/2 |
| 5,972,862 A | * | 10/1999 | Torii et al. ................... 510/175 |
| 6,043,206 A | * | 3/2000 | Song et al. ................. 510/175 |
| 6,090,214 A | * | 7/2000 | Zhou et al. ..................... 134/6 |
| 6,162,301 A | * | 12/2000 | Zhang et al. ................... 134/3 |
| 6,171,405 B1 | * | 1/2001 | Lee ................................ 134/3 |

* cited by examiner

*Primary Examiner*—Joseph J. Hail, III
*Assistant Examiner*—Anthony Ojini
(74) *Attorney, Agent, or Firm*—Blakely, Sokoloff, Taylor & Zafman LLP

(57) ABSTRACT

Methods for the chemical-mechanical polishing (CMP) of copper layers on integrated circuits are described, along with the chemical compositions of various pre- and post-polishing solutions. In one embodiment, a pre-polish cleaning operation with a complexing organic acid buffer system is performed prior to the CMP of the copper. In alternative embodiments, a rinse operation is performed subsequent to the cleaning operation and prior to the CMP. In further alternatives, a post-polish cleaning operation with a chelating agent is performed. In still further alternatives, the pH of a pre-polish cleaner is ramped during the pre-polish cleaning operation to match the pH of the polish slurry which is used, subsequent to the cleaning operation, to remove excess portions of the copper layer to be polished.

9 Claims, 4 Drawing Sheets

502

Clean surface of Cu layer with solution having a 1st pH which includes an organic acid chelating agent and no abrasives or oxidizers

504

Polish Cu layer with slurry having 2nd pH

506

Clean surface of Cu layer with solution having a 3rd pH which includes an organic acid chelating agent and no abrasives or oxidizers

302

Clean oxidation from the surface of a Cu layer without the use of abrasives

304

Chemically mechanically polish the cleaned Cu layer

Clean surface of Cu layer with solution having a 1st pH

404

Continue cleaning while changing pH of cleaning solution to a 2nd pH

406

Polish Cu layer with slurry having 2nd pH

Clean surface of Cu layer with solution having a 1st pH which includes an organic acid chelating agent and no abrasives or oxidizers

504

Polish Cu layer with slurry having 2nd pH

506

Clean surface of Cu layer with solution having a 3rd pH which includes an organic acid chelating agent and no abrasives or oxidizers

FIG. 5

METHOD AND CHEMISTRY FOR CLEANING OF OXIDIZED COPPER DURING CHEMICAL MECHANICAL POLISHING

This is a Divisional application of Ser. No.: 09/729,609 filed Dec. 4, 2000, which is presently pending.

BACKGROUND OF THE INVENTION

1. Field of the Invention

The present invention relates generally to the field of chemical mechanical polishing (CMP), and more specifically, to methods and chemistries for providing substantially corrosion-free copper surfaces.

2. Background

Advances in semiconductor manufacturing technology have led to the development of integrated circuits having multiple levels of interconnect. In such an integrated circuit, patterned conductive material on one interconnect level is electrically insulated from patterned conductive material on another interconnect level by films of material such as, for example, silicon dioxide. These conductive materials are typically a metal or metal alloy. Connections between the conductive material at the various interconnect levels are made by forming openings in the insulating layers and providing an electrically conductive structure such that the patterned conductive material from different interconnect levels are brought into electrical contact with each other. These electrically conductive structures are often referred to as contacts or vias.

Other advances in semiconductor manufacturing technology have led to the integration of millions of transistors, each capable of switching at high speed. A consequence of incorporating so many fast-switching transistors into an integrated circuit is an increase in power consumption during operation. One technique for increasing speed while reducing power consumption is to replace the traditional aluminum and aluminum alloy interconnects found on integrated circuits with a metal such as copper, which offers lower electrical resistance. Those skilled in the electrical arts will appreciate that by reducing resistance, electrical signals may propagate more quickly through the interconnect pathways on an integrated circuit. Furthermore, because the resistance of copper is significantly less than that of aluminum, the cross-sectional area of a copper interconnect line, as compared to an aluminum interconnect line, may be made smaller without incurring increased signal propagation delays based on the resistance of the interconnect. Additionally, because the capacitance between two electrical nodes is a function of the overlap area between those nodes, using a smaller copper interconnect line results in a decrease in parasitic capacitance. In this way, replacing aluminum-based interconnects with copper-based interconnects provides, depending on the dimensions chosen, reduced resistance, reduced capacitance, or both.

As noted above, copper has electrical advantages, such as lower resistance per cross-sectional area, the ability to provide for reduced parasitic capacitance, and greater immunity to electromigration. For all these reasons, manufacturers of integrated circuits find it desirable to include copper in their products.

While advantageous electrically, copper is difficult to integrate into the process of making integrated circuits. As is known in this field, copper can adversely affect the performance of metal oxide semiconductor (MOS) field effect transistors (FETs) if the copper is allowed to migrate, or diffuse, into the transistor areas of an integrated circuit. Therefore, copper diffusion barriers must be used to isolate copper metal from those transistor areas. Additionally, unlike aluminum-based metal interconnect systems which are formed by subtractive etch processes, copper interconnects are typically formed by damascene metal processes. Such processes are also sometimes referred to as inlaid metal processes.

In a damascene process, trenches are formed in a first layer, and a metal layer is formed over the first layer including the trenches. The first layer is an electrically insulating material. Excess metal is then polished off leaving individual interconnect lines in the trenches. When copper is the metal to be used, a copper diffusion barrier layer is disposed between the first layer and the copper. The removal of the excess copper is typically accomplished by chemical mechanical polishing. Although there are many known variations of the damascene method of metallization, the most common method for removing the excess copper metal is by CMP.

Accordingly, there is a need for CMP methods, materials, and apparatus to polish conductive materials such as copper.

BRIEF DESCRIPTION OF THE DRAWINGS

FIG. 3 is a flowchart showing the operations in a process of polishing a copper layer in accordance with the present invention.

FIG. 4 is a flowchart showing the operations in a process of polishing a copper layer in accordance with the present invention.

FIG. 5 is a flowchart showing the operations in a process of polishing a copper layer in accordance with the present invention.

DETAILED DESCRIPTION

Figure 1:
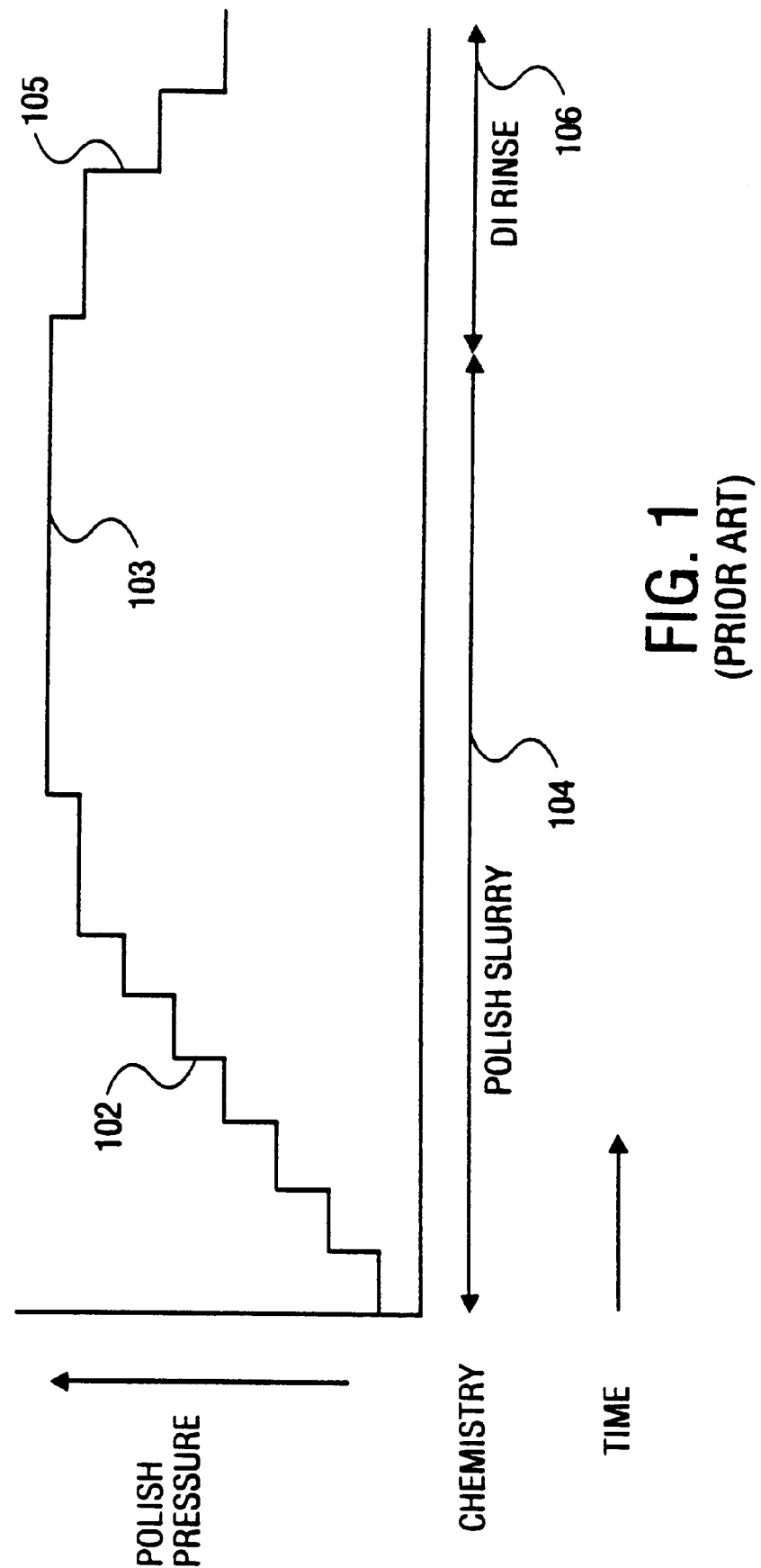
FIG. 1 is a diagram indicating the ramp-up and ramp-down in polishing pressure over time in conjunction with the slurry and rinse agents delivered to the polishing surface during prior art chemical mechanical polishing of copper.

Methods for the chemical-mechanical polishing of copper interconnect structures on integrated circuits are described, along with the chemical compositions of various pre- and post-polishing solutions. In the following description, numerous specific details are set forth to provide an understanding of the present invention. It will be apparent however, to those skilled in the art and having the benefit of this disclosure, that the present invention may be practiced with apparatus, compositions, and processes that vary from those specified herein.

Reference herein to "one embodiment", "an embodiment", or similar formulations, means that a particular feature, structure, or characteristic described in connection with the embodiment is included in at least one embodiment of the present invention. Thus, the appearances of such phrases or formulations herein are not necessarily all referring to the same embodiment. Furthermore, various particular features, structures, or characteristics may be combined in any suitable manner in one or more embodiments.

Terminology

The terms, chip, integrated circuit, monolithic device, semiconductor device or component, microelectronic device or component, and similar terms and expressions, are often used interchangeably in this field. The present invention is applicable to all the above as they are generally understood in the field.

The terms metal line, trace, wire, conductor, signal path and signaling medium are all related. The related terms listed above, are generally interchangeable, and appear in order from specific to general. In this field, metal lines are sometimes referred to as traces, wires, lines, interconnects or simply metal.

The terms contact and via, both refer to structures for electrical connection of conductors from different interconnect levels. These terms are sometimes used in the art to describe both an opening in an insulator in which the structure will be completed, and the completed structure itself. For purposes of this disclosure contact and via refer to the completed structure.

Chemical mechanical polishing is also known in this field as CMP. In a typical CMP system, a substrate, such as a wafer, is placed face down on a rotating table, sometimes referred to as a platen, covered with a polishing pad, which has been coated with a slurry. A carrier, which may be attached to a rotatable shaft, is used to apply a downward force against the backside of the substrate. A retaining ring may be used to center the substrate onto the carrier and to prevent the substrate from slipping laterally. By applying the downward force, and rotating the substrate, while simultaneously rotating a slurry covered pad, a desired amount of material may be removed from the upper surface of a thin film on the surface of the substrate. Face-up polishing systems are also available, and the present invention is not limited by the particular style of polishing tool that is used.

Substrate, as used herein, refers to the physical object that is to be polished by means of the CMP process. A substrate may be a wafer. Wafers, may be made of semiconducting, non-semiconducting, or combinations of semiconducting and non-semiconducting materials. Silicon wafers may have thin films of various materials formed upon them. These thin films may be planarized with CMP processing. Other substrate materials such as, for example, GaAs, silicon-on-sapphire, or silicon on insulator (SOI) may be polished, or planarized, with CMP processing.

The term vertical, as used herein, means substantially perpendicular to the surface of a substrate.

RPM (also rpm) refers to revolutions per minute.

Overview

Polishing of copper metal layers in connection with the formation of conductive interconnect lines for integrated circuits is becoming more important for the semiconductor industry. Unlike aluminum metallization, which is typically formed on integrated circuits by subtractive metal etch, copper interconnect lines are typically formed by way of a damascene, or inlaid, metal process. Such a process requires the removal, typically by chemical mechanical polishing, of the excess copper. Copper tends to form an oxide layer on its exposed surfaces which increases the difficulty of achieving copper CMP.

Conventional methods of copper polishing for integrated circuit manufacturing include receiving plated wafers, either directly from a plating operation, or from a post-plating annealing operation. Such copper-plated (alternatively referred to as copper-coated) wafers, as mentioned above, typically have an undesired oxide layer that has formed on the surface of the copper. The oxidized surface layer on the copper has been observed to reduce the polish rate and/or increase the non-uniformity of the polishing process. Similarly, oxidized portions of the post-polish copper surface are seen as residual defects that adversely affect subsequent manufacturing operations.

Referring now to FIG. 1, a diagram of a conventional process is shown which indicates a polishing pressure ramp-up phase 102, a main polishing phase 103 with a substantially constant pressure, and a polishing pressure. ramp-down phase 105, in conjunction with the slurry and rinse agents delivered to the polishing surface during these conventional phases of the chemical mechanical polishing of copper for integrated circuits. As indicated in FIG. 1, a polishing slurry is used for a period 104 that corresponds to ramp-up phase 102 and main polishing phase 103, followed by a rinse with de-ionized (DI) water for a period 106 that corresponds to ramp-down phase 105. This is typically accomplished with a single polishing platen of a CMP tool. In this example, the polishing pressure of main polishing phase 103 is in the range of 2 to 5 psi. Such a conventional process does not address the problems associated with the undesired oxidation on the copper surface.

Method

In embodiments of the present invention, copper damascene structures are polished to form individual interconnect lines.

As is well-known in this field, formation of a damascene structure typically includes patterning an interlayer dielectric layer (ILD) to form a structure with trenches and via openings, and forming a copper diffusion barrier over the exposed surfaces of the ILD. Various materials may be used as the copper diffusion barrier. Both tantalum and tantalum nitride are advantageous copper diffusion barriers. Typically a copper seed layer is then formed on the copper diffusion barrier. A complete copper layer is then formed, typically by plating, over the diffusion barrier. Subsequent to the formation of the copper layer, excess copper is removed by CMP in order to form the individual interconnects.

Figure 2:
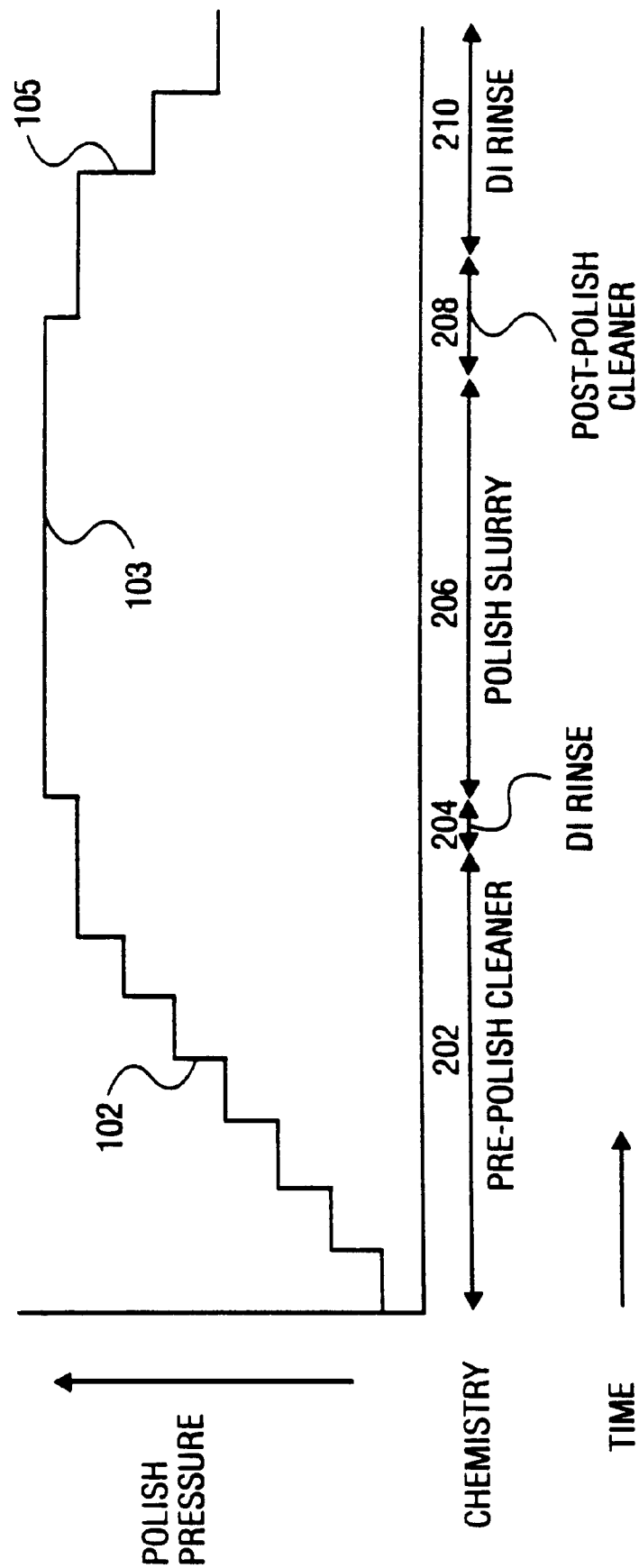
FIG. 2 is a diagram indicating the ramp-up and ramp-down in polishing pressure over time in conjunction with the pre-polish cleaning chemistry, rinse agent, slurry, post-polish chemistry, and rinse agents delivered to the polishing surface during chemical mechanical polishing of copper in accordance with one embodiment the present invention.

Referring now to FIG. 2, a diagram of a process in accordance with the present invention is shown which indicates a polishing pressure ramp-up phase 102, a main polishing pressure phase 103 having a substantially constant pressure, and a polishing pressure ramp-down phase 105, in conjunction with the pre-polish chemistry, slurry, post-polish chemistry, and rinse agents delivered to the polishing surface during chemical mechanical polishing of a copper layer on integrated circuits. The pre-polish chemistry may be referred to as a pre-polish cleaning solution, or a pre-polish cleaner. The post-polish chemistry may be referred to as a post-polish cleaning solution, or a post-polish cleaner. As indicated in FIG. 2, a pre-polish chemistry, i.e., a chemical formulation different from that of the polishing slurry, is used for a period 202 that corresponds to a first portion of ramp-up phase 102, a DI water rinse is used for a period 204 corresponding to a second portion of ramp-up phase 102, a polishing slurry is used for a period 206 that corresponds to main polishing phase 103, a post-polish chemistry, i.e., a chemical formulation different from that of the polishing slurry, is used for a period 208 that corresponds to a first portion of ramp-down phase 105, followed by a rinse with de-ionized water for a period 210 that corresponds to a second portion of ramp-down phase 105. This embodiment of the present invention may be alternatively implemented with one or more polishing platens. The various cleaners, rinses, and slurries may be delivered to the polishing equipment by way of one or more dispensers. The various ingredients may be pre-mixed and delivered to the polishing pad by pumping through a dispenser. Alternatively, various single ingredients, or combinations of ingredients, may be pumped through a plurality of dispensers and thereby delivered to the polishing pad.

In the embodiment of FIG. 2, polishing pressure ramp-up phase 102 represents a range of zero to five pounds per square inch (psi). In typical embodiments the high end of the pressure ramp is in the range of 1 to 5 psi.

Table 1, below, illustrates a high-level view of copper CMP process flows, and shows, various combinations of processing operations such as pre- and post-polish treatments, rinses, and polishing that can be used in accordance with the present invention. The row labelled "Prior Art" indicates that conventional processes simply polish the copper layer using a polishing slurry. Example #1, shows a process in which a pre-polish treatment and then polishing are performed. Example #2 shows a pre-polish treatment, followed by a rinse operation, followed in turn by a polish operation. Example #3 shows a pre-polish treatment, followed, without a rinse operation, by polishing, and followed by a post-polishing treatment. Example #4 is similar to Example #3, but includes a rinse operation which is performed between the pre-polish treatment and the polishing operation. Example #5 identical to Example #4 except that a rinse operation is performed subsequent to the post-polish treatment. Example #6 begins with a copper polishing operation and concludes with a scrubberless post-polish treatment. Finally, Example #7, is identical to Example #6, except that a rinse operation is performed subsequent to the post-polish treatment.

TABLE 1

|  | Pre-polish treatment | Rinse | Polish | Post-polish treatment | Rinse |
| --- | --- | --- | --- | --- | --- |
| Prior Art |  |  | X |  |  |
| Example #1 | X |  | X |  |  |
| Example #2 | X | X | X |  |  |
| Example #3 | X |  | X | X |  |
| Example #4 | X | X | X | X |  |
| Example #5 | X | X | X | X | X |
| Example #6 |  |  | X | X |  |
| Example #7 |  |  | X | X | X |

An embodiment of the method of polishing a copper layer on a wafer, in accordance with the present invention, is described in conjunction with FIG. 3. More particularly, in this illustrative embodiment, the copper layer is subjected to a pre-polish cleaning operation. This cleaning operation is typically performed at room temperature, but is not required to be at room temperature. As shown in FIG. 3, oxidation is cleaned from the surface of a copper layer prior to polishing (302). This oxidation cleaning operation removes oxidized portions of the copper surface so as to facilitate the initiation of chemical mechanical polishing. The cleaning solution includes a chelating organic acid buffer system and does not include the abrasives or oxidizers that are typically added to copper polish slurries. In this regard, the pre-polish cleaning solution is substantially free of abrasives and oxidizers. Subsequent to the cleaning operation, the copper layer is subjected to a CMP operation (304).

Another embodiment of the present invention is described in conjunction with FIG. 4. After a copper, or copper alloy, layer is plated onto a wafer, it is cleaned with a cleaning solution having a first pH (402). This cleaning, in accordance with the present invention, is designed to remove oxidation from the surface of the copper or copper alloy surface. As described above, the cleaning is done on a polishing tool, but the cleaning solution does not include abrasives or oxidizers as are found in polishing slurries. The cleaning operation then continues, but with the cleaning solution delivered to the polishing tool being modified over time such that its pH is ramped towards the pH of the polishing slurry that will be used to remove the excess copper or copper alloy (404). Finally the polish slurry is introduced and chemical mechanical polishing takes place in order to remove the excess portions of metal and thereby form individual interconnect lines (406). In some embodiments of the present invention, the polish slurry is formed simply by delivering an abrasive and an oxidizer to the polishing tool, where in combination with the cleaning solution a complete polishing slurry is formed.

Yet another illustrative embodiment is described in conjunction with FIG. 5. A wafer plated with copper, or a copper alloy, is cleaned with a solution having a first pH (502). Such a cleaning operation is typically performed on the same, or a similar tool, as that which is used for chemical mechanical polishing. The cleaning solution, as described above, includes an organic acid chelating agent, but does not include abrasives, or oxidizers. After oxidation is removed from the metal surface, a CMP operation is performed with a Cu polish slurry having a second pH (504). Subsequent to polishing, a scrubberless cleaning operation is performed by delivering a post-polish cleaning solution having a third pH to the polishing tool (506).

The Pre-Polish Cleaning Chemistry

An exemplary pre-polish cleaner, in accordance with the present invention, for chemical mechanical polishing of copper, has a pH between 2.5 and 7.5, includes an organic acid buffer system, and is substantially free of oxidizers and abrasives. Various organic chelating agents may be used in embodiments of the present invention. Various complexing organic acids, such as but not limited to, carboxylic acids, may be used in embodiments of the present invention. Examples of complexing organic acid buffer systems include, but are not limited to, acetic acid and potassium acetate; citric acid and potassium citrate; citric acid and ammonium citrate; and ascorbic acid and potassium ascorbate. It is recognized that these buffer systems can also be created by adding KOH to the corresponding organic acid.

In one embodiment, the pre-polish cleaner is formed from citric acid and potassium citrate, and has a pH in the lower end of the above-described range; more particularly it has a pH in the range of 2.5 to 4. In one illustrative embodiment, the pre-polish cleaner is formed by combining, with water, 40 g/l of anhydrous citric acid and 40 g/l of potassium citrate monohydrate. In other embodiments of the present invention, the cleaning solution is formed from a combination of citric acid and potassium citrate wherein the amount of citric acid is in the range of 0 to 40 g/l and the amount of potassium citrate is in the range of 0 to 40 g/l, and wherein the total number of g/l is greater than 0.

Oxidizers and abrasives, such as are found in copper polish slurries, are not added to the pre-polish cleaner. However, because the pre-polish cleaner, except for the absence of oxidizers and abrasives, is chemically similar to the copper polish slurry, those having the benefit of this disclosure will recognize that, one simply needs to begin pumping abrasive and oxidizer solutions to the polishing pad at about the same time that the pre-polish cleaning is being completed. The oxidizers and abrasives may be pre-mixed, or delivered separately to the polishing pad. The oxidizers and abrasives may also serve to dilute the buffer concentration. A corrosion protecting agent, such as benzotriazole, which would typically be used in a copper polish slurry, is not required in the illustrative embodiment, but may be added in concentrations comparable to that found in a copper polish slurry.

In some embodiments of the present invention, the pH of the pre-polish cleaner and the pH of the polishing slurry are the same. In other embodiments of the present invention, the pre-polish cleaner and the polish slurry are formulated such that they each have a different pH. For example, this may be necessary in, but not limited to, cases where a pre-clean pH lower than that of the slurry will increase the initial polish rate while a pre-clean pH higher than the slurry pH may induce slurry gelation. In such an instance a rinse step may be used subsequent to the pre-clean operation and prior to polishing with the desired slurry.

In an alternative embodiment, the chemical mixture that comprises the pre-polish cleaner is modified during the course of pre-polish cleaning so that the pH of the pre-cleaning solution is ramped to match the pH of the polishing slurry. By matched, it is meant that the difference in pH between the pre-polish cleaner and the polishing slurry is reduced to a range of zero to 0.2 pH units. The rate of change of pH may be linear, or non-linear, continuous, or step-wise. The change in pH may be to increase or decrease the pH, depending on the difference in pH between the initial pre-polish cleaner and the polish slurry.

As can be understood by those skilled in the art, the pre-polish cleaner pH change described above is implemented by changing the concentration of various ingredients in pre-polish cleaner.

The Post-Polish Cleaning Chemistry

An exemplary post-polish cleaner, in accordance with the present invention, for chemical mechanical polishing of copper, has a pH between 2.5 and 7.5, includes an organic acid buffer system, and is substantially free of oxidizers and abrasives. Examples of organic acid buffer systems include, but are not limited to, acetic acid and potassium acetate; citric acid and potassium citrate; and ascorbic acid and potassium ascorbate. Oxidizers and abrasives, such as are found in copper polish slurries, are not added to the post-polish cleaner.

In one embodiment, the post-polish cleaner is formed from citric acid and potassium citrate and has a pH in the lower end of the above-described range; more particularly it has a pH in the range of 2.5 to 4. In one illustrative embodiment of the present invention, the post-polish cleaner is formed by combining with water, 3 g/l anhydrous citric acid and 3 g/l potassium citrate monohydrate. A corrosion protecting agent, such as benzotriazole, which would typically be used in a copper polish slurry, is not required in the illustrative embodiment but may be added in concentrations comparable to that found in a copper polish slurry.

As discussed above in connection with matching the pH of the pre-polish cleaner to that of the polishing slurry, it is also advantageous to match the pH of the post-polish cleaner to that of the post-polish cleaner in order to reduce the interactions between the post-polish cleaner and the polishing slurry that may lead to undesired changes in the polishing rate, or that may lead to slurry gelation.

In some embodiments of the present invention wherein the pH of the post-polish cleaner is different from that of the polishing slurry, a rinse operation is performed subsequent to the polishing operation and prior to the post-polish cleaning operation.

In alternative embodiments of the present invention wherein the pH of the post-polish cleaner is different from that of the polishing slurry, the pH of the post-polish cleaner is modified to match that of the polishing slurry. This pH modified post-polish cleaner is then used for the cleaning operation, and during the course of the post-polish cleaning operation, the chemistry of the post-polish cleaner is modified such that the pH is changed from that of the polishing slurry, to the desired target range of the post-polish cleaner chemistry. By matching the pH between the polishing slurry and the post-polish cleaner it is meant the difference between them is in the range of 0 to 0.2 pH units.

Since the goal of the in-situ post-polish chemistry is to clean up wafers prior to the next polishing step, embodiments of the present invention can used either after copper polish in the case of a one step polish, or after diffusion barrier polish when a two step Cu/diffusion barrier polish is used to create the damascene structure.

The polishing pads used in the various illustrative examples described above were a Freudenberg FX-9 pads (available from Freudenberg of Lowell, Mass.) and a Rodel IC1000/suba 4 stack available from Rodel, Inc., 3804 East Watkins Street, Phoenix, Ariz. 85034). It is recognized that other pads, including but not limited to, a Rodel Polytech may used depending on the results obtained by a user in terms of the impact on defects, dishing, and erosion.

Conclusion

The examples herein are provided simply to illustrate the present invention. Those skilled in the art will appreciate that a post-polish cleaner formulated in accordance with the present invention may also include some complexes, mixture products, reaction products, and/or decomposition products of the various ingredients. In other words, those skilled in this field, recognize that a solution which is obtained by combining various ingredients may actually contain other chemical ingredients that result from the ingredients having been combined.

Embodiments of the present invention provide methods and compositions for treating surfaces of copper metallization layers on substrates (in which integrated circuits are formed) before CMP operations, after CMP operations, and both before and after CMP. In some embodiments, an organic acid based buffer system, such as for example, a citric acid and potassium citrate buffer system, is used to provide a complete polish process where the buffer solution can be applied before and/or after the copper polish.

An advantage of some embodiments of the present invention is that copper polishing is initiated more quickly than with conventional CMP of copper with an abrasive based slurry alone.

A further advantage of some embodiments of the present invention is that post-polish wafers are cleaner and have a significantly reduced incidence of defects.

A still further advantage of some embodiments of the present invention is that pre-polish treatment will significantly reduce the rate at which the copper-coated surface of the wafer will oxidize in atmospheric conditions.

It will be apparent to those skilled in the art that a number of variations or modifications may be made to the illustrative embodiments described above. For example, variations such as cleaning solution pH, cleaning solution delivery rate, pad rotation speed, pad temperature, and so on, may be used within the scope of the present invention. Similarly, it is noted that although the illustrative embodiments herein are discussed in terms of polishing copper, the invention can be used with alloys of copper, such as those used to reduce electromigration. Such copper alloys are metals that may be referred to as a copper-based layer. Furthermore, embodiments of the present invention can be whether a one-step polish (copper or copper alloy is polished but an underlying diffusion barrier is treated separately) or a two-step polish (copper or copper alloy, and an underlying diffusion barrier are polished in one substantially continuous process) is used.

Other modifications from the specifically described apparatus, cleaning solutions, and processes will be apparent to those skilled in the art and having the benefit of this disclosure. Accordingly, it is intended that all such modifications and alterations be considered as within the spirit and scope of the invention as defined by the subjoined claims.

What is claimed is:

1. A method of removing excess metal from a surface of a wafer, comprising:

cleaning the surface of the wafer by bringing the surface into contact with a first rotatable polishing pad onto which a first solution is dispensed, the first solution being substantially free of abrasives, and the first solution formed, at least in part, by mixing a complexing organic acid buffer system with water, and the surface of the wafer having at least one metal layer comprising copper thereon; and bringing the surface of the substrate into contact with a second rotatable polishing pad onto which a polishing slurry is dispensed;

wherein the pH of the first solution and the polishing slurry are different.

2. The method of claim 1, further comprising modifying the pH of the first solution during the cleaning of the surface.

3. The method of claim 2, wherein the first and second rotatable pads are the same pad.

4. The method of claim 3, wherein modifying the pH of the first solution comprises changing the pH of the first solution to match the pH of the polishing slurry.

5. The method of claim 4, wherein dispensing the polishing slurry comprises continuing to dispense the pH modified cleaner, and, through additional dispensers, providing an abrasive and an oxidizer to the polishing pad.

6. The method of claim 5, further comprising, subsequent to polishing the wafer with the polishing slurry, cleaning the polished wafer with a second cleaning solution that is formed by combining a complexing organic acid buffer system with water and excluding abrasive and oxidizing ingredients.

7. A method of removing excess metal from a surface of a wafer, comprising:

bringing the surface of the substrate into contact with a first rotatable polishing pad onto which a polishing slurry is dispensed; and cleaning the surface of the wafer by bringing the surface into contact with a second rotatable polishing pad onto which a first solution is dispensed, the first solution being substantially free of abrasives, and the first solution formed, at least in part, by mixing a complexing organic acid buffer system with water, and the surface of the wafer having at least one metal layer comprising copper thereon; and wherein the pH of the first solution and the polishing slurry are matched.

8. The method of claim 7, wherein the first and second rotatable pads are the same pad.

9. The method of claim 8, further comprising modifying the pH of the first solution.

* * * * *